United States Patent [19]

Yoshida

[11] Patent Number: 5,031,008
[45] Date of Patent: Jul. 9, 1991

[54] MOSFET TRANSISTOR

[75] Inventor: Masayuki Yoshida, Kawasaki, Japan

[73] Assignee: Kabushiki Kaisha Toshiba, Kawasaki, Japan

[21] Appl. No.: 491,470

[22] Filed: Mar. 12, 1990

[30] Foreign Application Priority Data

Mar. 10, 1989 [JP] Japan ................................ 1-56331

[51] Int. Cl.$^5$ ............................................ H01L 29/78
[52] U.S. Cl. .................................. 357/23.3; 357/23.1;
357/23.9.23.4; 357/23.12
[58] Field of Search .................... 357/23.4, 23.12, 23.9,
357/23.1, 23.3

[56] References Cited

U.S. PATENT DOCUMENTS

| 4,173,818 | 11/1979 | Bassous et al. | 357/23.12 |
| 4,714,519 | 12/1987 | Pfiester | 437/81 |
| 4,924,277 | 5/1990 | Yamane et al. | 357/23.4 |
| 4,925,807 | 5/1990 | Yoshikawa | 357/23.3 |

FOREIGN PATENT DOCUMENTS

| 5222480 | 2/1977 | Japan | 357/23.12 |
| 58-115861 | 7/1983 | Japan | 357/23.9 |
| 62-293772 | 12/1987 | Japan | 357/23.1 |
| 137055 | 2/1988 | Japan | 357/23.3 |
| 63-144574 | 6/1988 | Japan | 357/23.3 |
| 63-181468 | 7/1988 | Japan | 357/23.3 |

OTHER PUBLICATIONS

IBM Technical Disclosure Bulletin, vol. 22, No. 6, Nov. 1979, "Double Polysilicon Depletion-Mode MOS Transistor Structure", by Varshney, pp. 2292-2293.

S. Ogura et al., "A Half Micron Mosfet Using Double Implanted LDD", IBM., IEDM 82, Tech Digest, 1982, pp. 718-721.

IBM Technical Disclosure Bulletin, vol. 22, No. 6, Nov. 1979, pp. 2292-2293, R. C. Varshney: "Double Polysilicon Depletion-Mode Transistor Structure".

Patent Abstracts of Japan, vol. 9, No. 169 (E-328)[1892], Jul. 13, 1985, JP-60-43863.

Patent Abstracts of Japan, vol. 10, No. 213 (E-422)[2269], Jul. 25, 1986, JP-61-53773.

Primary Examiner—Rolf Hille
Assistant Examiner—Steven Loke
Attorney, Agent, or Firm—Foley & Lardner

[57] ABSTRACT

A MOSFET transistor, in which source and drain regions are formed at a certain distance away from each other in a surface area of a semiconductor substrate having a first conductivity type, and a gate electrode is formed on the surface of the substrate through a gate insulating film formed thereon between the source and drain regions, and in which a channel region located in the surface area of the substrate between the source and drain regions is composed of different concentration regions, and a threshold voltage of a high concentration channel region is lower than that of a low concentration channel region.

2 Claims, 4 Drawing Sheets

MOSFET TRANSISTOR

BACKGROUND OF THE INVENTION

1. Field of the Invention

The present invention relates to a MOSFET transistor having a channel region composed of different impurity concentration regions.

2. Description of the Background Art

In FIG. 1, there is shown a conventional N-channel MOS transistor which comprises a P-type semiconductor substrate 1, an N-type polycrystalline silicon gate electrode 3 formed on the surface of the substrate 1 via a gate insulating oxide film 5, and a drain 7 and a source 9 formed in the surface area of the substrate 1 in the right and left sides of the gate electrode 3.

In this case, in order to determine a threshold voltage to a relatively large value such as approximately 0.6 to 0.8V, it is necessary to fairly raise the concentration of the P-type impurity in the substrate 1. That is, when polycrystalline silicon implanted with an N-type impurity is used for the gate electrode 3, since the work function difference between the substrate 1 and the gate electrode 3 becomes large, the impurity concentration in the substrate 1 is necessarily increased so as not to form an inversion layer in a channel region 11 in the surface area of the substrate 1 between the drain and source regions 7 and 9.

On the other hand, when the gate oxide film 5 is thinned as the device is miniaturized, the impurity concentration in the substrate 1 must be increased in order to obtain a large threshold voltage. That is, even when the device is miniaturized, the reduction of the threshold voltage causes the increase of the leakage current, and hence the threshold voltage can not be reduced largely. Accordingly, as the device is miniaturized, the impurity concentration in the substrate is increased.

As described above, the impurity concentration increase in the substrate invites the fall-off of the carrier mobility. That is, when the impurity concentration in the substrate is increased, the electric field in the direction perpendicular to the substrate increases to cause the carrier dispersion in the surface area and the impurity dispersion due to the impurity concentration increase which affect the fall-off of the carrier mobility. Further, the impurity concentration increase in the substrate brings about the increase of the variation rate of the threshold voltage increase (back bias effect) while a reverse bias is applied between the source and substrate, thereby lowering the characteristics of the device. Further, it becomes difficult to operate the device in high speed, and the current driving ability thereof is reduced.

Meanwhile, when the gate electrode 3 is made of a metal having a high melting point, a silicide thereof or an undoped polycrystalline silicon, the work function difference between the substrate 1 and the gate electrode 3 becomes small, thereby enabling the reduction of the impurity concentration in the substrate even when the large threshold voltage is obtained.

However, in such a case, the depletion layer is liable to extend from both the drain and source regions 7 and 9 toward the channel region 11. Hence, when the depletion layers extending from the drain and source regions 7 and 9 are contacted with each other, a short-circuit is caused between them to cause the punch-through phenomenon. Also, even when such depletion layers do not contact with each other, the depletion layers extending in the channel region 11 bring about the short channel effect.

In order to prevent or minimize such punch-through phenomenon and short channel effect, p pocket regions are provided in the surface area of the substrate between the ends of the gate elecrode and the drain and source regions, as disclosed in the documents "IEDM 82 Tech Digest (1982), pp 718-721, Seiki Ogura et al,".

In FIG. 2, there is shown a conventional N-channel MOS transistor having p pocket regions 13 in the surface area of the substrate 1 between the ends of the gate electrode 3 and the drain and source regions 7 and 9. The p pocket regions 13 implanted with an N-type high concentration impurity are formed in a deep position under silicon oxide ($SiO_2$) side walls 15 on the gate electrode 3 between the drain and source regions 7 and 9 by using a technique for providing such side walls 15. The p pocket regions 13 function so as to restrain the extension of the depletion layers from the drain and source regions 7 and 9, thereby preventing the punch-through.

In such a case, since the p pocket regions 13 are formed of a P-type high concentration region and become highly resistant, when the p pocket regions 13 are formed right under the side walls 15, the driving force of the device is reduced, and a high electric field is produced in the channel region 11 to generate hot electrons. Therefore, the p pocket regions 13 should be formed in a deep position below the surface area of the channel region 11.

As described above, in any of the conventional MOS transistors, it is quite difficult to effectively improve the high speed operation of the device and the current driving ability and to effectively prevent the punch-through phenomenon and the short channel effect.

SUMMARY OF THE INVENTION

Accordingly, it is an object of the present invention to provide a MOSFET transistor, free from the aforementioned defects and disadvantages of the prior art, which is capable of performing a high speed operation of the transistor and a high current driving ability without causing a punch-through phenomenon and a short channel effect.

In accordance with one aspect of the present invention, there is provided a MOSFET transistor, comprising a semiconductor substrate having a first conductivity type, source and drain regions formed at a certain distance away from each other in a surface area of the substrate, and a gate electrode formed on a surface of the substrate through a gate insulating film formed thereon between the source and drain regions, a channel region located in the surface area of the substrate between the source and drain regions being composed of different concentration regions, and a threshold voltage of a high concentration channel region being lower than that of a low concentration channel region.

BRIEF DESCRIPTION OF THE DRAWINGS

The above and other objects, features and advantages of the present invention will more fully appear from the following description of the preferred embodiments with reference to the accompanying drawings, in which.

DESCRIPTION OF THE PREFERRED EMBODIMENTS

Figure 3:
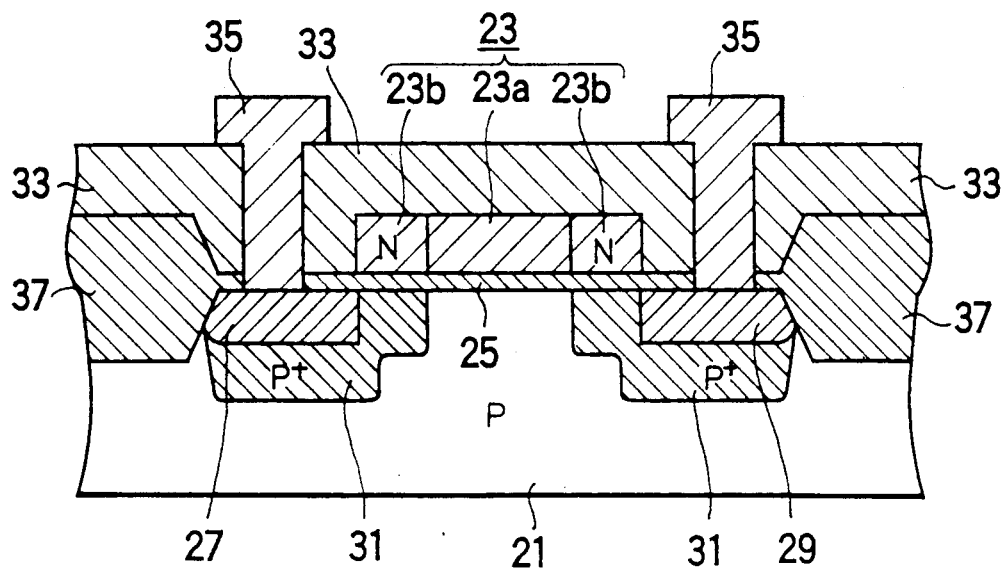
FIG. 3 is a longitudinal cross section of a first embodiment of a MOSFET transistor according to the present invention.

Referring now to the drawings, wherein like reference characters designate like or corresponding components throughout the several views and thus the repeated description thereof may be omitted for the brevity, there is shown in FIG. 3 the first embodiment of an N-channel MOSFET transistor according to the present invention.

In the drawing, the N-channel MOSFET transistor is formed on a P-type single crystal silicon semiconductor substrate 21, i.e., a gate electrode 23 is formed on the surface of the substrate 21 via a gate insulating oxide film 25 between a drain 27 and a source 29 formed in the surface area of the substrate 21 in the right and left sides of the gate electrode 23.

The gate electrode 23 is integrally composed of a central gate member 23a of undoped polycrystalline silicon and a pair of side gate members 23b of N-type polycrystalline silicon doped with an N-type impurity such as As, and the central gate member 23a is arranged between the side gate members 23b.

A pair of P-type impurity regions 31 having a higher impurity concentration than that of the substrate 21 is formed to extend in the lower portions right under the drain and source regions 27 and 29 and the side portions on the drain and source regions 27 and 29 and under the side gate members 23b of the gate electrode 23. A field oxide film 37 as a device separation region covers the surface of the substrate 21 to separate the devices from one another. A silicon oxide ($SiO_2$) surface protecting film 33 as a passivation film is formed to cover the gate electrode 23 and the entire surface of the device. Aluminum wires 35 are connected to the drain and source regions 27 and 29 through the surface protecting film 33 and the gate insulating film 25.

A method for producing the MOSFET transistor described above will now be described in detail in connection with FIGS. 4a to 4d.

In FIG. 4a, on a P-type single crystal silicon semiconductor substrate 21 having an impurity concentration of approximately $3 \times 10^{18}$ cm$^{-3}$ a field oxide film 37 of silicon nitride having a thickness of approximately 6000 Å for constituting a device separation region is formed so as to surround a transistor formation region. A gate insulating oxide film 25 having a thickness of approximately 100 Å is formed over the surface of the substrate 21 surrounded by the field oxide film 37, and then an undoped polycrystalline silicon film (not shown) having a thickness of approximately 2000 Å is deposited on the entire surface of the gate oxide film 25 by using the CVD (chemical vapor deposition) method. A photoresist material is applied on the undoped polycrystalline silicon film, and a patterning of the photoresist material is carried out to obtain a photoresist masking pattern 41 on the undoped polycrystalline silicon film. Then, by using the photoresist masking pattern 41 an etching process of the undoped polycrystalline silicon film is performed by the RIE (reactive ion etching) method to obtain an undoped polycrystalline silicon gate electrode 23 on the gate oxide film 25.

In FIG. 4b, the photoresist masking pattern 41 is partially etched by the oxygen plasma treatment to expose both sides of the gate electrode 23. By using a partially etched photoresist masking pattern 43. As ions are implanted into the surface of the substrate 21 including the gate electrode 23 under the condition such as at acceleration energy of approximately 20 keV with a dose of approximately $5 \times 10^{15}$ cm$^{-2}$ to obtain side gate members 23b of an N-type polycrystalline silicon in the gate electrode 23 and also drain and source regions 27 and 29 of an N-type diffusion region in the surface area of the substrate 21 in the left and right sides of the gate electrode 23 at the same time.

In FIG. 4c, by using the masking pattern 43, B ions are implanted into the surface of the substrate 21 including the gate electrode 23 under the relatively high energy condition such as at acceleration energy of approximately 100 keV with a dose of approximately $1 \times 10^{12}$ cm$^{-2}$, and then, after removing the masking pattern 43, the obtained substrate 21 with the gate electrode 23 is annealed at approximately 600° C. in a lamp annealing treatment. In this case, since the B ions are implanted at the relative high energy, the shooting range of the B ions is relatively deep such as approximately 3000 Å in depth, and hence P-type impurity regions 31 having a higher impurity concentration than that of the substrate 21 are formed under the side gate members 23b in a channel region in the surface of the substrate 21 between the drain and source regions 27 and 29, and also right under the drain and source regions 27 and 29.

In FIG. 4d, a silicon oxide ($SiO_2$) surface protecting film 33 as a passivation film is formed over the entire surface of the obtained substrate 21 with the gate electrode 23 thereon. Then, holes for wiring are opened in the surface protecting film 33 and the gate oxide film 25 by an etching or an appropriate manner so as to reach the drain and source regions 27 and 29, and aluminum wires 35 are formed in the holes to contact with the drain and source regions 27 and 28, thereby obtaining the N-channel MOSFET transistor shown in FIG. 3.

Figure 5:
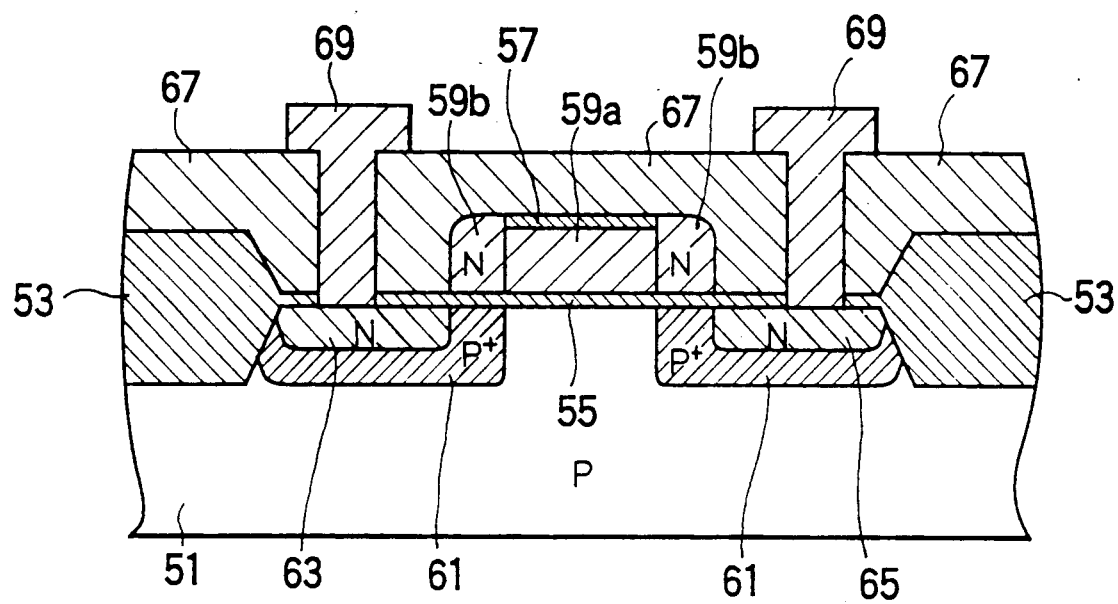
FIG. 5 is a longitudinal cross section of a second embodiment of a MOSFET transistor according to the present invention.

In FIG. 5, there is shown the second embodiment of an N-channel MOSFET transistor according to the present invention, having the same construction as that of the first embodiment shown in FIG. 3, except that a central gate member 59a of a gate electrode 59 is composed of molybdenum silicide. That is, a gate electrode 59 is composed of the central gate member 59a of molybdenum silicide and a pair of side gate members 59b of N-type polycrystalline silicon doped with an N-type impurity such as As, and the central gate member 59a is arranged between the side gate members 59b.

A method for producing the MOSFET transistor shown in FIG. 5 will now be described in detail in connection with FIGS. 6a to 6d.

In FIG. 6a, a field oxide film 53 is formed on a P-type single crystal silicon semiconductor substrate 51, and a gate insulating oxide film 51 is formed over the surface of the substrate 51 in the same manner as the first embodiment described above. Then, a molybdenum silicide film (not shown) having a thickness of approximately 5000 Å and another silicon oxide film (not shown) are consecutively deposited on the entire surface of the gate oxide film 51. Then, by using a photoresist masking pattern (not shown), the silicon oxide film and the molybdenum silicide film are successively etched by the RIE method to obtain a molybdenum silicide central gate member 59a of a gate electrode 59 with a silicon oxide film 57 formed thereon. Then, by using the central gate member 59a with the silicon oxide film 57 formed thereon as a masking pattern, B ions are implanted into the surface of the substrate 21 under the energy condition such as at acceleration energy of approximately 80 keV with a dose of approximately $8 \times 10^{11}$ cm$^{-2}$ and are also implanted into the surface of the substrate 21 under the energy condition such as at acceleration energy of approximately 30 keV with a dose of approximately $8 \times 10^{11}$ cm$^{-2}$, and then the obtained substrate 51 with the central gate member 59a is annealed at approximately 600° C. in a lump annealing treatment to obtain P-type impurity regions 61 having a higher impurity concentration than that of the substrate 51 in the surface area of the substrate 51 in the right and left sides of the central gate member 59a.

In FIG. 6b, an N-type polycrystalline silicon film (not shown) doped with an N-type impurity such as As is deposited on the entire surface of the substrate 51 and the central gate member 59a, and then the deposited N-type polycrystalline silicon film is partially etched back by the RIE method to obtain the N-type polycrystalline silicon side gate members 59b on the gate oxide film 55 in contact with both the sides of the central gate member 59a.

In FIG. 6c, by using the gate electrode 59 composed of the central gate member 59a and the side gate members 59b as a mask, As ions are implanted into the surface of the substrate 51 under the condition such as at acceleration energy of approximately 30 keV with a dose of approximately $5 \times 10^{15}$ cm$^{-2}$, and then the lump annealing treatment is carried out to obtain drain and source regions 63 and 65 of an N-type diffusion region in the surface areas of the left and right P-type impurity regions 61.

In FIG. 6d, a silicon oxide (SiO$_2$) surface protecting film 67 and aluminum wires 69 are formed in the same manner as the first embodiment described above, thereby obtaining the N-channel MOSFET transistor shown in FIG. 5.

Figure 7:
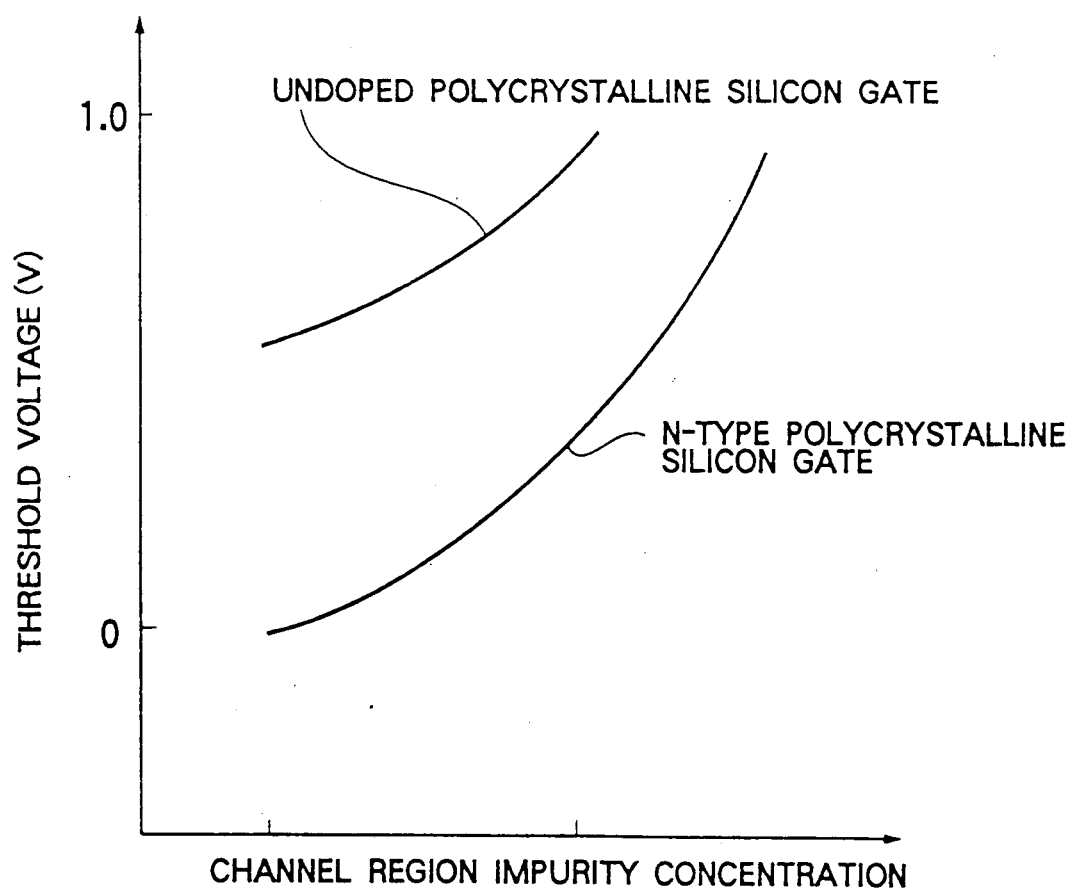
FIG. 7 is a graphical representation showing characteristics of the transistor shown in FIGS. 3 and 5.

In FIG. 7, there are shown curves for representing the relation between the threshold voltage and the impurity concentration of the channel region of the two preferred embodiments described above in the transistor according to the present invention. It is readily understood from FIG. 7 that the threshold voltage is changed by a certain amount corresponding to the work function difference depending on the fact whether or not the gate electrode contains the impurity. That is, the threshold voltage of the gate electrode containing the impurity is restricted to a fairly low value as compared with that of the containing no impurity.

In the preferred embodiments described above, the threshold voltages in the regions under the undoped polycrystalline silicon central gate member 23a or the molybdenum silicide central gate member 59a and under the N-type polycrystalline silicon side gate members 23b or 59b were approximately 0.7V and 0.4V, respectively. Hence, in the channel region in the surface area of the substrate between the drain and source regions, the side regions adjacent to the drain and source regions under the side gate members have a high impurity concentration than that of the substrate and a lower threshold voltage than that of the central region under the central gate member.

Figure 1:
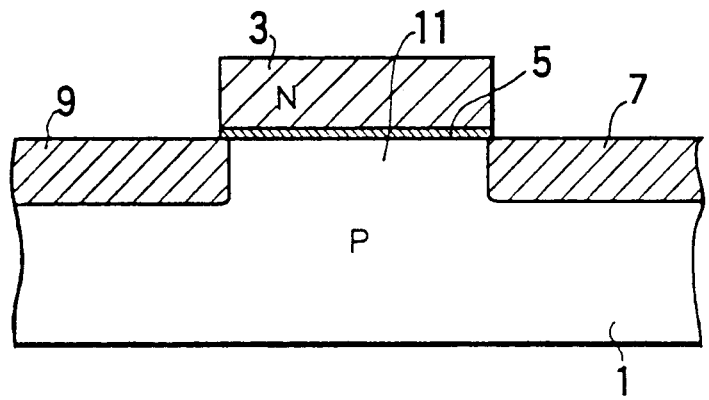
FIG. 1 is a longitudinal cross section of a conventional MOSFET transistor.
Figure 2:
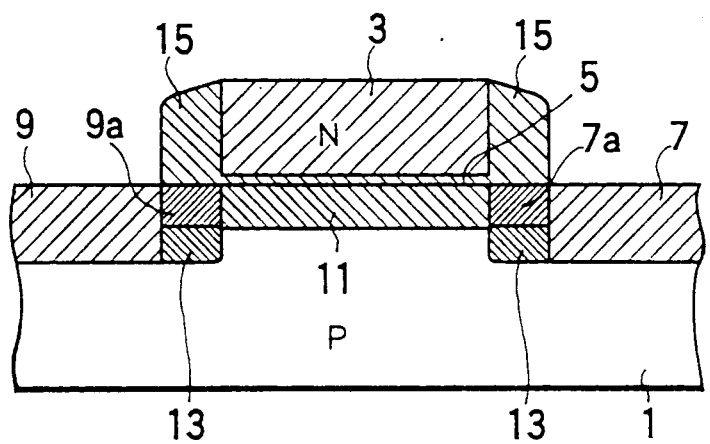
FIG. 2 is a longitudinal cross section of another conventional MOSFET transistor having p pocket regions.

In the transistor according to the present invention, relating to the current driving ability, it is approximately equal to that of the conventional one shown in FIG. 2, and is approximately 20% higher than that of the conventional one shown in FIG. 1. It is considered that the increase of the current driving ability in the transistor of the present invention is obtained by the carrier mobility increase caused by the decrease of the electric field in the direction perpendicular to the substrate due to the drop of the impurity concentration in the substrate. Therefore, when the impurity concentration in the substrate must be increased as the miniaturization of the device is advanced, since the carrier mobility variation by the Coulomb scattering is to be added, the current driving ability difference will become more remarkable.

On the other hand, in the transistor according to the present invention, the short channel effect is improved as compared with the conventional one including the molybdenum silicide gate electrode, as shown in FIG. 2. The conventional transistor shown in FIG. 2 can normally operate until the channel length is up to 0.7 μm, but the present transistors can normally operate until the channel length is up to 0.5 μm. This means that, even when the miniaturization of the device is advanced, the punch-through phenomenon can be effectively reduced by increasing the impurity concentration in the P-type impurity regions 31 or 61 in the preferred embodiments shown in FIGS. 3 and 5.

In the transistor of the present invention, the N-type polycrystalline silicon side gate members can be formed in a self-aligned manner with respect to the undoped polycrystalline silicon central gate member, and hence superior controllability and reproducibility of such a gate electrode structure can be obtained, with the result of the above described effects and advantages.

Figure 4:
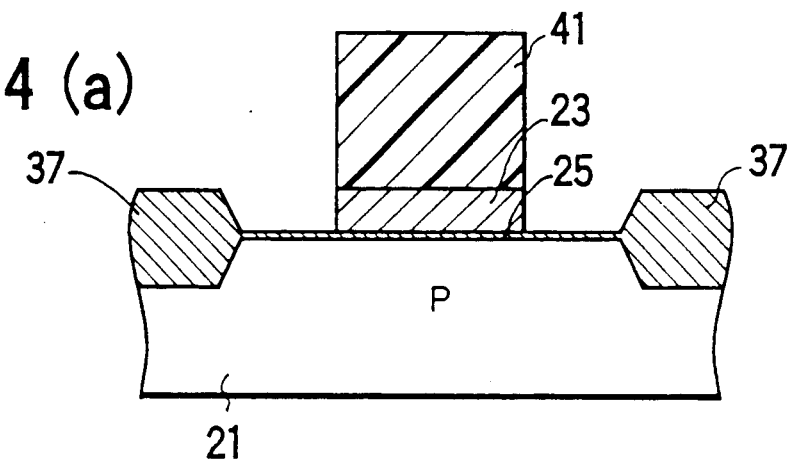
FIGS. 4a to 4d show a method for producing the MOSFET transistor shown in FIG. 3.
Figure 4:
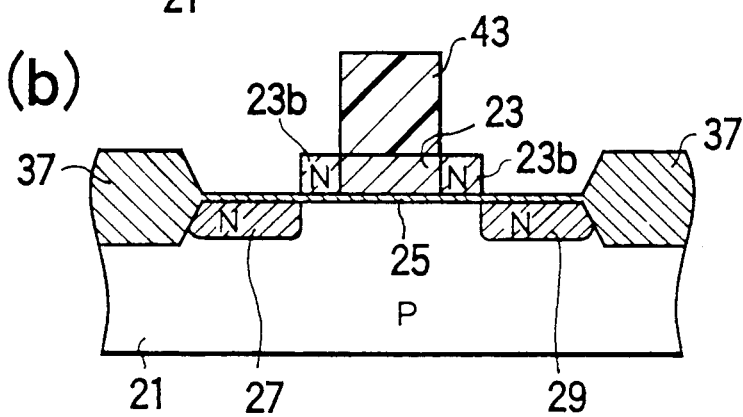
Figure 4:
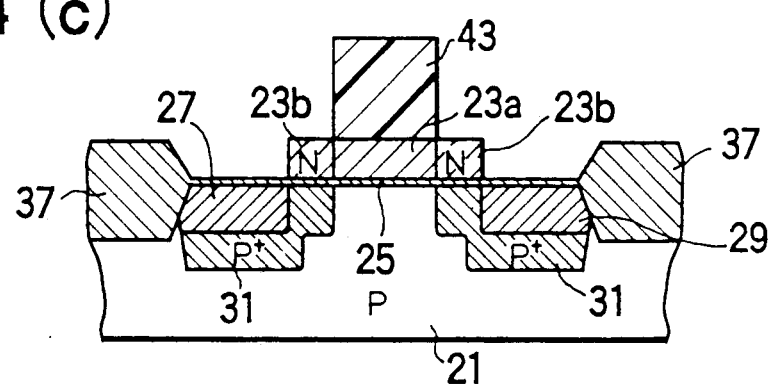
Figure 4:
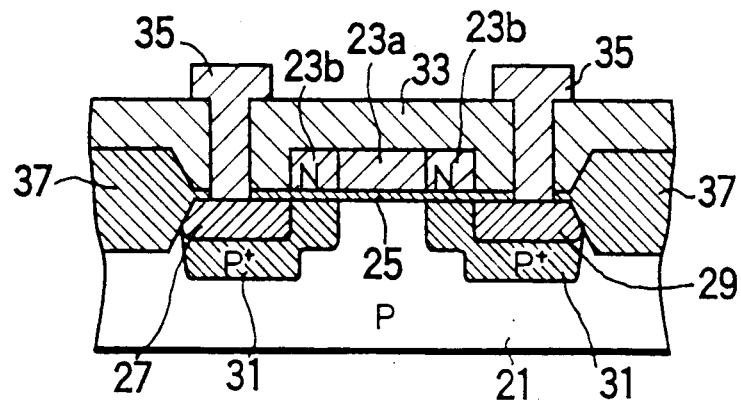
Figure 6:
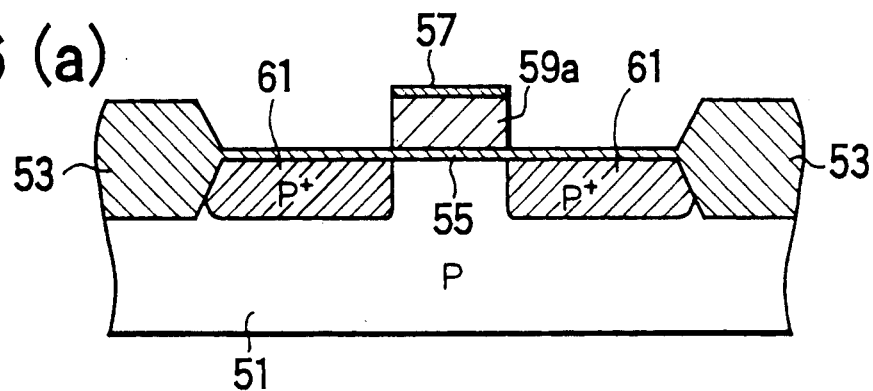
FIGS. 6a to 6d show a method for producing the MOSFET transistor shown in FIG. 5.
Figure 6:
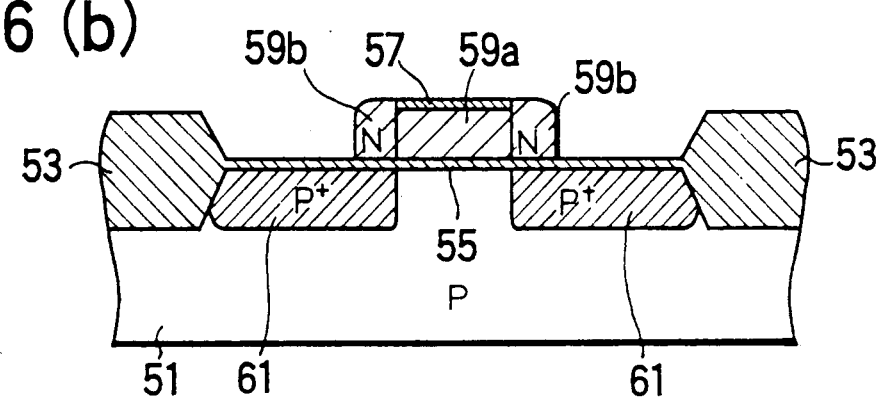
Figure 6:
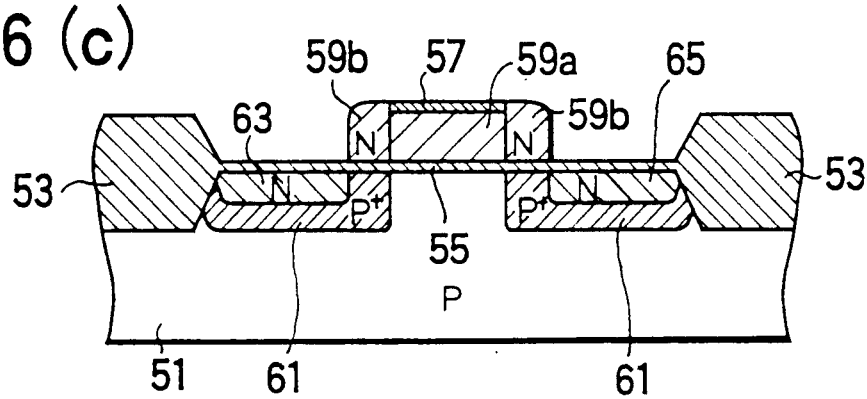
Figure 6:
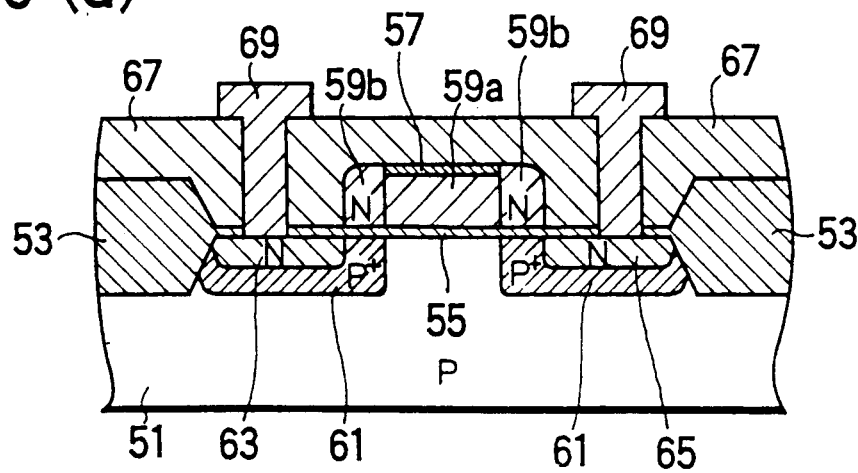

Further, the transistor of the present invention can be fabricated without increasing the number of the steps, as shown in FIGS. 4 and 6, and the cost increase for fabricating such a transistor can be prevented.

Also, the present invention can be applied to a P-channel MOSFET transistor by reversing the polarity of the impurity to be doped into the substrate, the drain and source regions and the polycrystalline silicon and the polarity of the impurity regions formed in the channel region.

Although the central gate member is formed by the undoped polycrystalline silicon or the molybdenum silicide in the preferred embodiments, a material having a work function between N-type and P-type polycrystalline silicons can be properly used with the same effects.

In the transistor shown in FIG. 4, in order to reduce the junction resistance between the undoped polycrystalline silicon central gate member 23a and the N-type polycrystalline silicon side gate members 23b and a contact resistance between these gate members and a gate wiring, a silicide having a high melting point may be attached on the gate electrode. In such a case where another material is present on a gate electrode, since the work function of the gate electrode can be determined by a material in the gate oxide film side, the same effects and advantages as those described above can be obtained.

As described above, according to the present invention, the channel region is composed of the different impurity concentration regions, and the threshold voltage of the high impurity concentration region in the channel region is lower than that of the low impurity concentration region. Accordingly, the extension of the depletion layer can be effectively controlled by the high concentration region in the channel region, and the resistance in the high concentration region can be reduced. Further, by the low concentration region in the channel region, the drop of the carrier mobility and the increase of the back bias effect can be prevented, thereby preventing the cause of the punch-through phenomenon and the short channel effect. Therefore, according to the present invention, MOSFET transistors having quick operativity and high current driving ability can be obtained.

Although the present invention has been described in its preferred embodiments with reference to the accompanying drawings, it it readily understood that the present invention is not restricted to the preferred embodiments and that various changes and modifications can be made by those skilled in the art without departing from the spirit and scope of the present invention.

What is claimed is:

1. A MOSFET transistor, comprising:

a semiconductor substrate having a first conductivity type;

source and drain regions formed at a certain distance away from each other in a surface area of the substrate, said source and drain regions having a second conductivity type opposite to the first conductivity type;

a gate electrode formed on a surface of the substrate through a gate insulating film formed thereon between the source and drain regions, the gate electrode including a central gate member formed in a central portion of the gate electrode and side gate members formed in both side end portions of the gate electrode, the central gate member being selected from the group consisting of an undoped semiconductor film, a metal and a metallic silicide, the side gate members being a semiconductor film having the second conductivity type; and a channel region located in the surface area of the substrate between the source and drain regions being composed of different concentration regions, the channel region including a low concentration channel region formed in a central portion and high concentration channel regions formed in side end portions, the central gate member being located above the low concentration channel region and the side gate members being located above the high concentration channel regions adjacent to the source and drain regions so that a threshold voltage of the high concentration channel regions is lower than that of the low concentration channel region.

2. The transistor of claim 1, wherein the high concentration channel regions extend in parts of the channel region, adjacent to the source and drain regions and right under the source and drain regions.

* * * * *